US011205901B2

(12) United States Patent
Alizadeh-Mousavi et al.

(10) Patent No.: US 11,205,901 B2
(45) Date of Patent: Dec. 21, 2021

(54) METHOD FOR ESTIMATING THE TOPOLOGY OF AN ELECTRIC POWER NETWORK USING METERING DATA

(71) Applicant: DEPSYS SA, Puidoux (CH)

(72) Inventors: Omid Alizadeh-Mousavi, Vevey (CH); Joël Jaton, Pully (CH)

(73) Assignee: DEPSYS SA, Puidoux (CH)

( * ) Notice: Subject to any disclaimer, the term of this patent is extended or adjusted under 35 U.S.C. 154(b) by 142 days.

(21) Appl. No.: 16/646,269

(22) PCT Filed: Sep. 11, 2018

(86) PCT No.: PCT/IB2018/056918
§ 371 (c)(1),
(2) Date: Mar. 11, 2020

(87) PCT Pub. No.: WO2019/053588
PCT Pub. Date: Mar. 21, 2019

(65) Prior Publication Data
US 2020/0287388 A1 Sep. 10, 2020

(30) Foreign Application Priority Data
Sep. 12, 2017 (EP) .................... 17190611

(51) Int. Cl.
*H02J 3/38* (2006.01)
*H02J 13/00* (2006.01)
*G01R 19/25* (2006.01)

(52) U.S. Cl.
CPC .......... *H02J 3/388* (2020.01); *G01R 19/2513* (2013.01); *H02J 3/381* (2013.01); *H02J 13/00012* (2020.01); *H02J 2203/20* (2020.01)

(58) Field of Classification Search
None
See application file for complete search history.

(56) References Cited

U.S. PATENT DOCUMENTS 10,224,717 B2   3/2019  Murphy et al.
10,431,979 B2   10/2019 Gouin et al.
(Continued)

FOREIGN PATENT DOCUMENTS

CA       2689776 A1    7/2010
CN     105552887 A    5/2016
(Continued)

OTHER PUBLICATIONS

Ahmed, M. et al., "Power Line Communications for Low-Voltage Power Grid Tomography," IEEE Transactions on Communications, vol. 61, No. 12, Dec. 2013.
(Continued)

*Primary Examiner* — Mohammad Ali
*Assistant Examiner* — Saad M Kabir
(74) *Attorney, Agent, or Firm* — Nixon & Vanderhye

(57) ABSTRACT

Disclosed is a method for identifying the topology of an electric power network allows for the automatic and efficient identification of network topology without the knowledge of network parameters. The method is based on the estimation of mutual current sensitivity coefficients and on an algorithm to obtain the network incidence matrix from the estimated sensitivity coefficients. This algorithm is based on the general assumption that the metering unit that is the most sensitive to the variations of the measured current in a branch connected to a particular node is the metering unit that is arranged at the physical node immediately upstream form the particular node. The method effectively considers the presence of noise in the measurements and its time correlation.

20 Claims, 8 Drawing Sheets

(56) References Cited

U.S. PATENT DOCUMENTS

| | | | |
|---|---|---|---|
| 10,547,513 | B2 | 1/2020 | Beyer et al. |
| 2007/0005277 | A1 | 1/2007 | Bickel et al. |
| 2010/0007219 | A1 | 1/2010 | De Buda et al. |
| 2012/0089384 | A1 | 4/2012 | Coyne et al. |
| 2012/0136638 | A1 | 5/2012 | Deschamps et al. |
| 2013/0035885 | A1 | 2/2013 | Sharon et al. |
| 2013/0304266 | A1* | 11/2013 | Giannakis ............ G06Q 20/145 700/286 |
| 2014/0032144 | A1 | 1/2014 | Kussyk |
| 2014/0039818 | A1 | 2/2014 | Arya et al. |
| 2015/0033103 | A1 | 1/2015 | Glickman et al. |
| 2015/0052088 | A1 | 2/2015 | Arya et al. |
| 2015/0153153 | A1 | 6/2015 | Premm et al. |
| 2015/0241482 | A1 | 8/2015 | Sonderegger |
| 2016/0109491 | A1 | 4/2016 | Kann |

FOREIGN PATENT DOCUMENTS

| | | |
|---|---|---|
| CN | 104600699 B | 8/2016 |
| EP | 2458340 A2 | 5/2012 |
| EP | 3065250 A1 | 9/2016 |
| EP | 3086093 A1 | 10/2016 |
| WO | 2012/031613 A1 | 3/2012 |
| WO | 2013/026675 A1 | 2/2013 |
| WO | 2015/193199 A1 | 12/2015 |
| WO | 2017/097346 A1 | 6/2017 |

OTHER PUBLICATIONS

Arya, V. et al., "Inferring Connectivity Model from Meter Measurements in Distribution Networks," e-Energy'13, May 21-24, 2013, pp. 173-181.

Bolognani, S. et al., "Identification of power distribution network topology via voltage correlation analysis," in 52nd EEE Conference on Decision and Control, Florence, 2013.

Deka, D. et al., "Estimating Distribution Grid Topologies: A Graphical Learning based Approach," in Power Systems Computation Conference, Genova, 2016.

Erseghe, T. et al., "Plug and Play Topology Estimation via Powerline Communications for Smart Micro Grids," IEEE Transactions on Signal Processing, vol. 61, No. 13, pp. 3368-3377, 2013.

Kekatos, V. et al., "Online Energy Price Matrix Factorization for Power Grid Topology Tracking," IEEE Transactions an Smart Grid, 2015, vol. 7, No. 3, pp. 1239-1248, 2016.

Lampe, L. and Ahmed, M., "Power Grid Topology Inference Using Power Line Communications," IEEE SmartGridComm 2013 Symposium—Communication Networks for Smart Grids and Smart Metering, pp. 336-341.

Li, X. et al., "Blind Topology Identification for Power Systems," in IEEE International Conference on Smart Grid Communications, Vancouver, 2013.

Nicoletta, B. et al., "Topology Identification of Smart Microgrids," 2013.

Wen, M. et al., "Phase Identification in Distribution Networks with Micro-Synchrophasors," in IEEE Power & Energy Society General Meeting, Denver, 2015.

Jayadev et al., "Identifying Topology of Power Distribution Networks Based on Smart Meter Data", 2016, <https://arxiv.org/pdf/1609.02678>.

International Search Report and Written Opinion, dated Nov. 12, 2018, from corresponding PCT application No. PCT/IB2018/056918.

* cited by examiner

METHOD FOR ESTIMATING THE TOPOLOGY OF AN ELECTRIC POWER NETWORK USING METERING DATA

The present invention generally relates to the field of electric power networks, and it is more specifically concerned with a method for estimating the topology of an electric power network without the knowledge of the network parameters and model, the electric power network comprising a set of nodes and a set of branches, each branch being arranged for connecting one node to another node, and the electric power network further being provided with a monitoring infrastructure comprising metering units and a processing unit connected to a communication network, the metering units also being connected to the communication network so as to allow for data transmission to and from the processing unit.

BACKGROUND OF THE INVENTION

The knowledge of the topology of the network is very important information for all power system studies as well as technically secure and economic optimal grid operation. Indeed, knowledge of physical grid structure is a basic ingredient for all power system studies, such as network monitoring and state estimation, as well as grid optimal control and management. Identification of the grid topology is very important from the reliability point of view and for many smart grid applications. In general, distribution system operators may not have an accurate and up-to-date knowledge of the network topology, especially in the case of low voltage networks. Moreover, although the distribution grids are usually operated radially, switching from one radial topology to another one can be practiced by line workers and the status of switches/breakers can possibly change without this information reaching the system operators in due time. In the case of a change in the network topology, the system operator may need to validate the status of switches/breakers after the topology change. Therefore, the updated knowledge of the grid topology is an important information for the technically secure and economically optimal operation of grid. Moreover, the automatic identification of a grid topology based on measurements of electrical quantities is very important for many smart grid applications, specifically for those applications with plug and play functionality.

The topic of grid topology identification has been widely studied. In the available literature, power distribution networks are basically modelled as a set of buses (or nodes) that are connected by lines (or branches). The buses stand for the junctions, substations, cabinets, generators or loads in the distribution network, and the lines (or branches) extending between the buses represent the wiring carrying electrical power from one bus to another. Researchers have used different approaches for identifying grid topology. These approaches include:
i) Power Line Communication (PLC) signals [1] [2] [3] [4] [5];
ii) Phasor Measurement Units (PMU) measurements [6] [7] [8] [9];
iii) measurement data from metering infrastructures [10] [11] [12] [13] [14] [15] [16] [17] [18] [19] [20];
iv) estimation of switches status using information of network model [21] [22] [23] [24] [29];
v) end-customer energy meter data [25] [26] [27]; and
vi) energy price signal [28].

Among the different approaches listed above, the one using measurement data from metering infrastructures is the most pertinent to the present invention. The identification of the grid topology from metering data is studied in the literatures using: correlation analysis between the time series of voltage changes [10] [11], voltage based clustering of customers [16], correlation analysis of voltage variations with respect to power variations [15], correlation coefficients between synchronized energy measurements [17], correlation analysis between synchronized measurements of current magnitude and its phase-angle [18], optimization based approaches [12] [13] [19], and principal component analysis of energy measurements [14]. The main drawbacks of these methods are:
- the non-random nature of the noise is not taken into account,
- the results can be imprecise depending on the length of lines connecting the metering units [10] [11] [15],
- computationally intensive to solve [12] [13] [19],
- all the loads in the network should be metered [14] [19], and
- energy losses are a source of noise and error in the estimation [14] [19],
- in [17], the correlation coefficient between synchronized energy measurements of a set of monitoring devices are used to identify the interrelationship between each pair of monitoring devices. Through an iterative procedure, the monitoring devices with the correlation coefficient larger than a defined threshold are considered to be directly linked to each other,
- the method in [18] is based on the synchronized measurement of current magnitude and its phase angle (i.e. complex values). In this method, it is preferred that the currents of all the branches connected to a node be measured. The correlation between the current measurements is used to obtain the network configuration that matches the best with the measurements. The method includes an iterative process based on regression analysis and solving an optimization problem. The main drawbacks of the method are: i) all branch currents are needed which means that the measurement devices should be used for all the nodes and branches, ii) Kirchhoff's current law is used to determine the current of missing branches which means that the information of the node-branch connectivity is assumed to be known whenever Kirchhoff's current law is used, ii) there are some parameters in the regression analysis that should be tuned.

SUMMARY OF THE INVENTION

It is therefore an object of the present invention to alleviate the above-described draw-backs and problems of the prior art. The present invention achieves this object by providing a method for identifying the topology of a power distribution network according to the appended claim 1.

In the present specification, the topology of a distribution network is defined as the connectivity between physical nodes of the network. The connectivity or topology of the network can be represented in the form of a graph, wherein each node of the graph represents one of the physical nodes and each edge of the graph represents a power line (or branch). A particular type of matrix, called an incidence matrix, is commonly used to represent the graph of an electric power network. An incidence matrix describes a network from a topological point of view, so that knowing the topology of the network implies knowing the incidence matrix and vice versa. The incidence matrix (A) of a graph describes the incidence of edges on nodes and is defined as follows for a non-directed graph:

$$A_{i \times j} = \begin{cases} 1 \text{ if edge } j \text{ is incident on } i \\ 0 \text{ if edge } j \text{ is not incident on } i \end{cases}$$

As, in the non-directed graph, each edge has two ends that are incident on different nodes. One will understand that there are exactly two "1"s in each column of the incidence matrix (A). In other words, the sum of each column of the incidence matrix is equal to 2.

According to the invention, the electric power network comprises metering units arranged at different physical nodes for measuring an electrical current flowing into, or out of, respective nodes through at least one branch. Furthermore, the determination of the connectivity of a network is based on the general assumption that the metering unit that is the most sensitive to the variations of the measured current in a branch connected to a particular node is the metering unit that is arranged at the physical node immediately upstream from said particular node.

Prior to determining the connectivity of the network, the method of invention comprises the task of statistically estimating the current sensitivity coefficients that link variations of the current flowing into, or out of, a particular node through at least one branch, to a concomitant variations of current flowing into, or out of, another node through at least one branch. These current sensitivity coefficients can be interpreted as estimations of the values of the partial derivative given below:

$$KII_{ij} \triangleq \frac{\partial I_i}{\partial I_j}$$

where $i,j \in \{1, \ldots, N\}$ identify metering units arranged at different physical nodes of the network, and $I_i$ and $I_j$ stand for the intensities of the currents that flows into, or out of, two different nodes, through at least one branch.

The current sensitivity coefficients are calculated using timestamped current intensity measurements provided by a plurality of metering units. The incidence matrix of the graph representing the connectivity of the electric power network can then be inferred from the sensitivity coefficients. Indeed, if metering unit B is located at a particular physical node, and a metering unit A is located at a physical node immediately upstream of said particular node, the current sensitivity coefficient of A with respect to B tends to be close to 1, because all current flowing into, or out of, said particular node also flows through the node immediately upstream of it. Therefore, the metering unit A observes the current variations of the metering unit B. Whereas, the current sensitivity coefficient of B with respect to A is close to 0, because metering unit B is located downstream of metering unit A and most of the current flowing into, or out of, the upstream node does not flow through said particular node. Most of the current variations in the upper level cannot be observed by metering unit B. Therefore, the large current sensitivity coefficients (e.g. close to 1) indicate the nodes that are directly or indirectly located in the upper level.

Some of the main advantages of the method of the invention are listed below:
The PMU measurements or the PLC signals are not needed.
The topology is identified using a limited amount of measurement data corresponding to a short period of time, for instance 2000 data points with 100-ms time step corresponding to 200 seconds.
No need for a model of the network and/or network parameters.
Only time-stamped current measurements are needed.
The algorithm is robust to the presence of noise in the measurements.
The system of equations are linear and thus the calculations are computationally efficient (in the contrary to the optimization based approaches).
In the case that the current flowing into, or out of, some of the network nodes is not monitored because measurement devices are only deployed on a limited number of physical nodes, the algorithm is capable to determine the connectivity between the measurement devices (i.e. topology). In other words, the algorithm does not need to place measurement devices everywhere in the network.

According to the invention, several metering units are arranged at different network nodes. The metering units are able to provide timestamped current measurements with a time interval that preferably lies between 60-ms and 10-s, most preferably 100-ms. It should be noted that the method of the invention only needs the timestamped current measurements. Each metering unit is placed at a node and it measures the current of at least a branch or multiple branches connected to that node. Thus, one of the nodes that a branch is connected to is known and the problem of topology identification is to find the other node that the branch is connected to.

An object of the invention is to identify the physical network connecting the metering devices, i.e. the network topology, only by using the measurement data. The method of the invention can be effectively implemented in the case that the metering devices are not deployed at all network nodes. Appended FIGS. 2 and 3 both show the same exemplary network comprising four buses and three feeder lines. FIG. 2 illustrates an exemplary case where 4 metering units have been allocated to the network (1 for at each physical node). As shown, the metering device at node 1 measures the current flowing through the transformer, and the metering devices at nodes 2, 3 and 4, measure the currents flowing through branches A, B and C, respectively. FIG. 3 shows another case where only 3 metering units have been allocated to the network. As in the previous case, the metering device at node 1 measures the current flowing through the transformer, and the metering devices at nodes 2 and 4, measure the currents flowing through branches A and C, respectively. However, there is no metering unit arranged at the remaining node. FIGS. 2 and 3 each further contain an incidence matrix corresponding to the illustrated deployment of metering units. In the case of FIG. 2, the network incidence matrix is a 4×3 matrix, where 4 stands for the number of nodes and 3 stands for the number of branches between the nodes. In the case of FIG. 3, the network incidence matrix is a 3×2 matrix reflecting the physical connectivity between the metering units.

The method of the invention is based on the current sensitivity coefficients. Current variation is selected as the criterion for identifying the network topology, because the current variations measured by a metering unit ($\Delta I_j$) can be observed by the metering units at the upper level node and/or by the metering units within the loop in which the node is located. For instances, for the network shown in FIGS. 2 and 3, the current variation at "Node 4" can also be observed in "Node 3" and "Node 1", whereas, it cannot be seen in "Node 2". Similarly, the current variation in "Node 2" can only be measured at "Node 1" and it cannot be observed at "Node 3" and "Node 4". It is worth noting that, observing the current variations of a branch upstream or downstream of a node is independent of the network parameters (i.e. conductor's type, size, and length), whereas the voltage variations at a node can be measured throughout the neighborhood depending on the network parameters. Therefore, using the current variations is a more efficient approach than the voltage variations for the identification of grid topology. Furthermore, it should be mentioned that the power flowing through a branch of the network (branch power) incident on a particular node is given by P=U I cos φ where I is the intensity of the current flowing through the branch, U is the voltage of the node on which the branch is incident and φ is the phase angle between the said voltage and said current. The person skilled in the art will understand that branch-power variations may behave in a way similar to branch-current variations, nevertheless the branch-power variations are also impacted by nodal-voltage variations. Thus, the utilization of the current variations is preferred to using branch-power variations.

The method of the invention may also be used to identify the topology when the network is operated in the islanding mode. For instance, appended FIG. 4 shows the network disconnected from the main grid by "switch" and operated in the islanding mode. It is assumed that generator "G1" is capable of controlling the network in the islanding operation mode and the node that the generator is connected to ("node 2") is considered as the slack node. In this case, the metering unit at "node 1" does not measure any current and the metering unit at the slack node ("node 2") observes the current variations of all the metering units. In other words, the proposed algorithm identifies the slack node and the network connectivity matrix, as shown in FIG. 4.

The current variations of branches are due to the nodal power variations. In other words, the power variations at every node of the grid results in the current variations in the branches in the upper level of the node as well as in the branches within the same loop. A similar method can be used for identification of network topology based on the current-power sensitivity coefficients linking the current variations of branches to the nodal power variations. This alternative current-power method is outlined further on in Example III at the end of the description.

Nevertheless, the current-power method requires that every metering unit calculates the active power at the measuring node. It implies that the metering unit at every measuring node is equipped with several current measurement devices, e.g. Rogowski coils or current transformer, to measure the currents of every branch connected to the measurement node (i.e. feeder). FIG. 10 shows a network and the required current measurements to calculate the nodal power variations. For example, branches B and C are both incident on node 3. Therefore, in order to calculate $\Delta P_3$, the power variations at "node 3", measurements of the current flowing into, or out of, node 3 through branch B, $I_B^3$, and measurements of to the current flowing into, or out of, node 3 through branch C, $I_B^3$, are both needed. Furthermore, the calculation of $\Delta PI$, the power variations at "node 1", requires knowledge of the currents $I_T^1$, $I_A^1$ and $I_B^1$. One will understand that, in this case, the large number of current measurements can be used more effectively for the identification of the physical connectivity between the nodes. However, in this case, the network topology can be identified more easily by comparison of the current measurements rather than using the current-power sensitivity coefficients. It is due to the fact that the current measurements at either ends of a branch have the most similar profiles. For instance, the measurement of the current through branch B at the point of connection with node 1 ($I_B^1$) is the most similar with the measurement of the current through branch B at the point of connection with node 3 ($I_B^3$). Therefore, the detailed description below is devoted to disclosing the method based on the mutual current sensitivity coefficients. This method is the most efficient for practical applications with a limited number of current measurements.

BRIEF DESCRIPTION OF THE DRAWINGS

Other features and advantages of the present invention will appear upon reading the following description, given solely by way of non-limiting example, and made with reference to the annexed drawings, in which.

DETAILED DESCRIPTION OF IMPLEMENTATIONS

The subject matter of the present invention is a method for estimating the topology of an electric power network. Accordingly, as the field, to which the invention applies, is that of electric power networks, an exemplary network will first be described. Actual ways in which the method can operate will be explained afterward.

Figure 1:
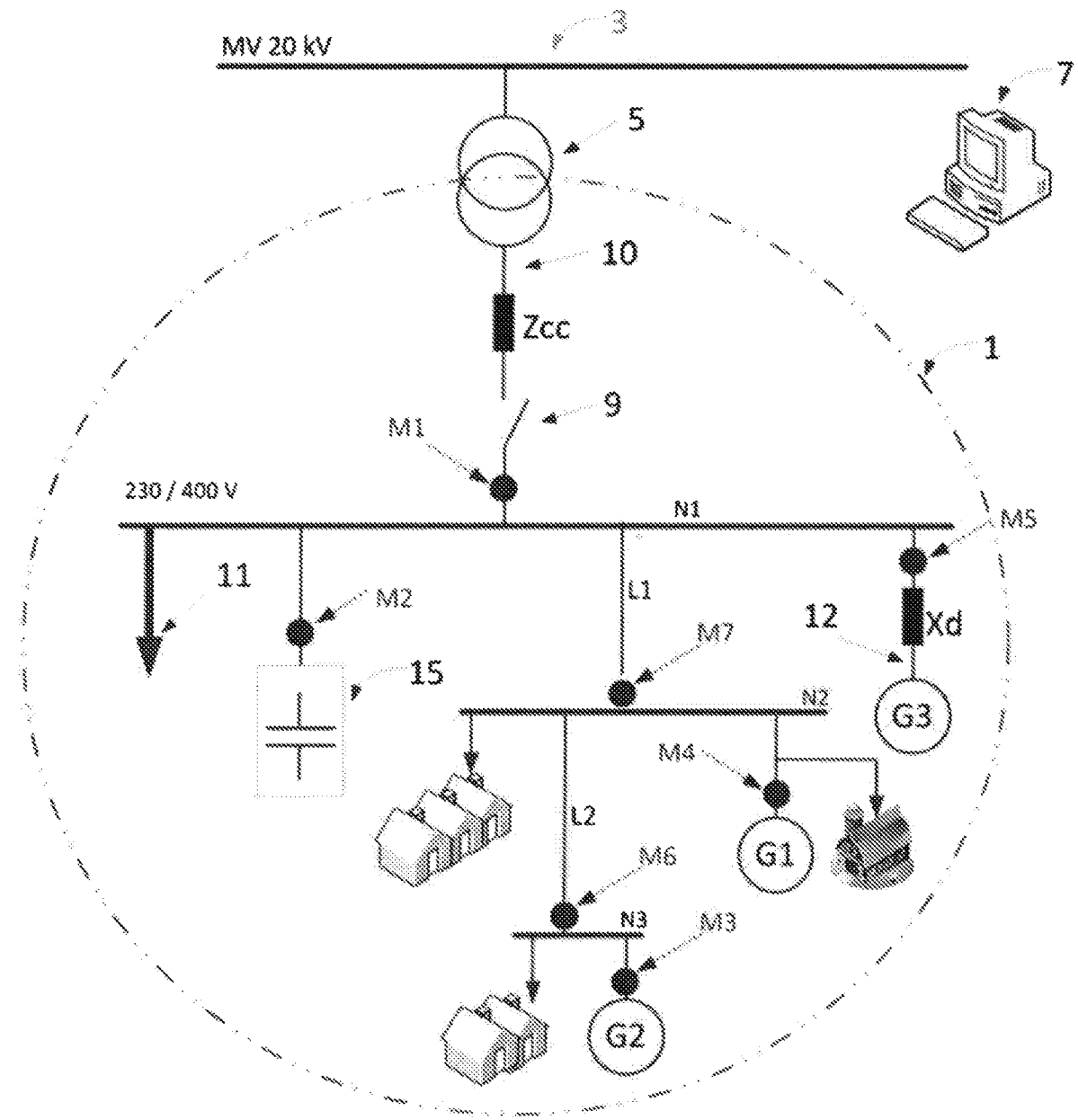
FIG. 1 is a schematic representation of an exemplary power distribution network that is used to explain particular implementations of the method of the invention.
Figure 2:
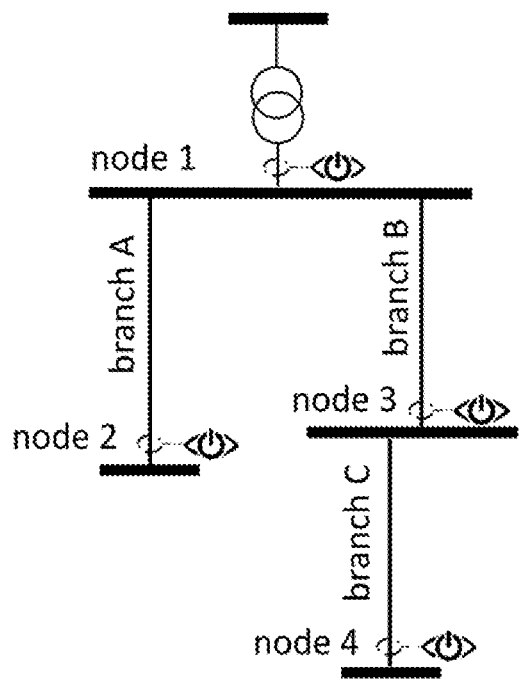
FIGS. 2 and 3 show two alternative allocation of metering devices to the same exemplary electrical network and the different resulting incidence matrices.
Figure 3:
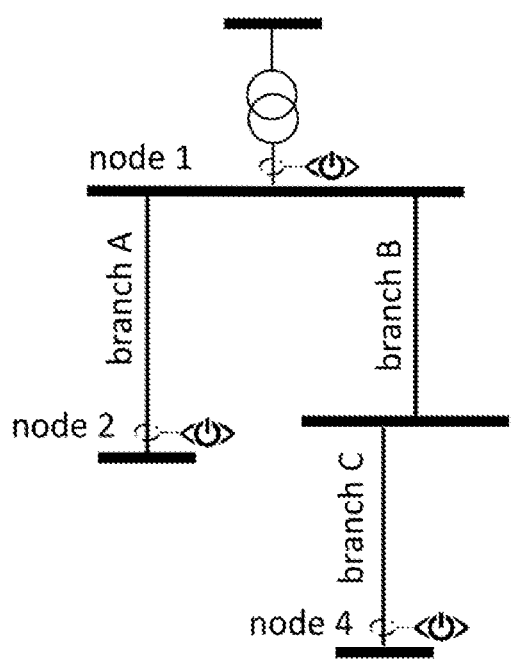
Figure 4:
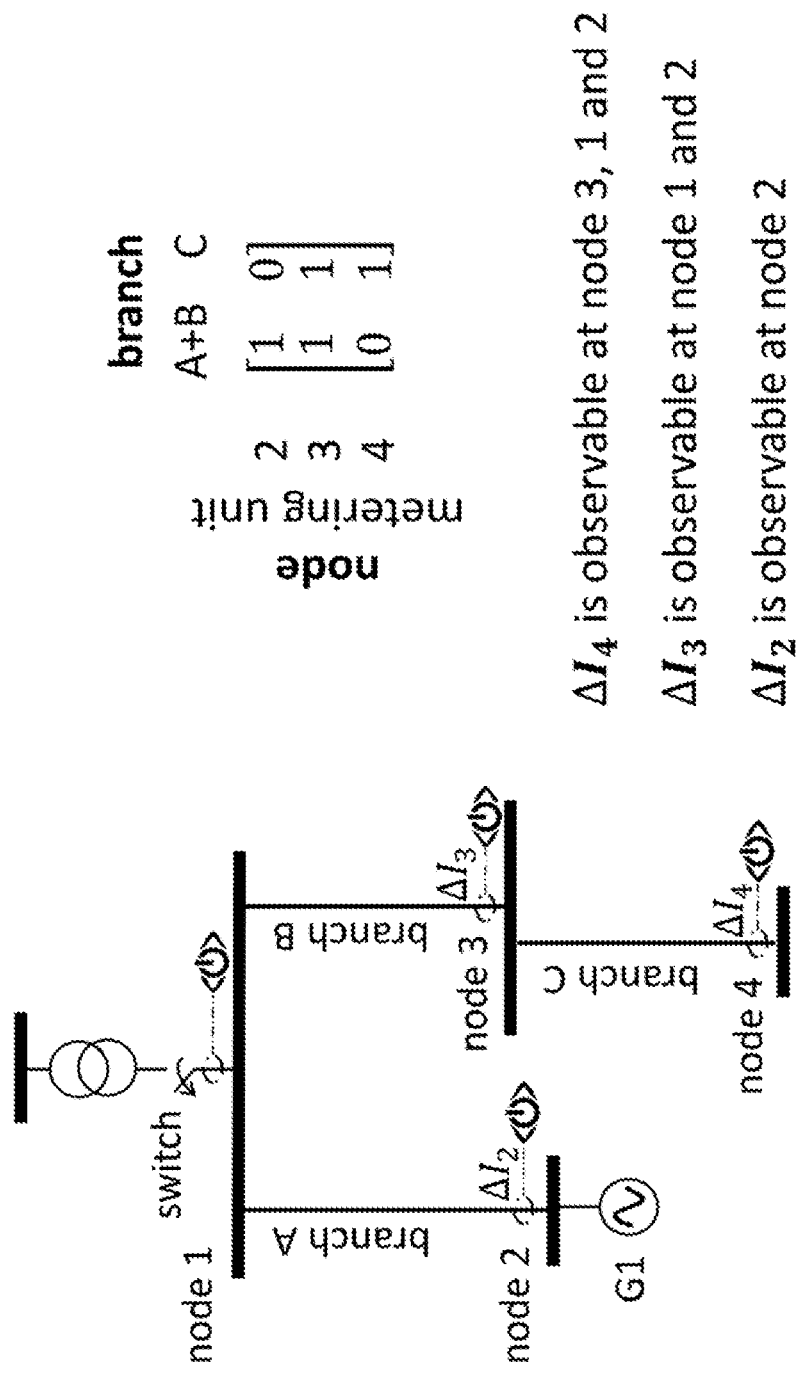
FIG. 4 shows an electrical network operation in islanding mode, as well as the corresponding incidence matrix.

FIG. 1 is schematic representation of an exemplary low-voltage radial distribution network (referenced 1) that is composed of 57 residential blocks, 9 agricultural buildings and supplies in total 88 customers. The low-voltage network 1 (230/400 Volts, 50 Hz) is linked to a medium voltage network 3 by a substation transformer. In FIG. 1, the substation transformer is represented as an ideal transformer (referenced 5) combined with an impedance Zcc that is intercalated between the output of the ideal transformer 5 and the rest of network 1. Table I (below) is intended to give an idea of possible characteristics for the substation transformer in this particular example:

TABLE I

| Power | Uin | Uout | Coupling | Ucc | X/R |
|---|---|---|---|---|---|
| 250 kVA | 20 kV | 230/400 V | DYn11 | 4.1% | 2.628 |

The substation transformer is connected to network 1 through a circuit breaker 9 and a first bus N1. In the network of the illustrated example, several feeder lines branch out from the bus N1. One of these feeder lines (referenced L1) is arranged to link a subset of five residential blocks and one agricultural building to the low-voltage network. It should be understood that the remaining 52 residential blocks and 8 agricultural buildings can be linked to the bus N1 by other feeder lines that are not explicitly shown in FIG. 1 (but are represented as a whole by a single arrow referenced 11).

The feeder line L1 connects the bus N1 to a second bus (referenced N2). As can be seen in FIG. 1, three residential blocks and one agricultural building are connected to the bus N2. Furthermore, a feeder line L2 connects the bus N2 to a third bus (referenced N3). Two residential blocks are connected to the bus N3. Table II (next page) is intended to give an idea of possible characteristics for the feeder lines L1 and L2 used in this particular example:

TABLE II

| | Cable type | Length | R/X [Ohm/km] | C [µF/km] |
|---|---|---|---|---|
| L1 | 1 kV 4 × 240 mm² AL | 219 m | 0.096; 0.072 | 0.77 |
| L2 | 1 kV 4 × 150 mm² AL | 145 m | 0.2633; 0.078 | 0.73 |

Still referring to FIG. 1, it can be seen that the network 1 further comprises three decentralized power plants. A first power plant (referenced G1) is a photovoltaic power plant connected to the bus N2, a second power plant (referenced G2) is a photovoltaic power plant connected to the bus N3, and the third power plant is a diesel powered generator, which is linked to the bus N1. As will be explained in more details further on, the third power plant is arranged to serve as a voltage reference generator when the power network 1 is operating in islanding mode. In FIG. 1, the diesel powered generator is represented as an ideal generator (referenced G3) combined with an impedance Xd that is intercalated between the output of the ideal generator G3 and the rest of network 1. Table IIIA and IIIB (below) are intended to give an idea of possible characteristics for the three decentralized power plants used in this particular example:

TABLE IIIA

| PV Generators | Number of inverters | Voltage [kV] | Rated power [kVA] |
|---|---|---|---|
| G1 | 12 3-phase inverters | 0.4 | 196 |
| G2 | 3 3-phase inverters | 0.4 | 30 |

TABLE IIIB

| Diesel Generator | Voltage [kV] | Synchronous reactance [Ω] | Rated power [kVA] |
|---|---|---|---|
| G3 | 0.4 | 3.2 | 50 |

One can observe that, according to the present example, the photovoltaic power plants G1 and G2 provide a maximum power of 226 kVA. FIG. 1 also shows a battery pack (referenced 15) that is connected to the bus N1 of the network 1. The combined presence of the three decentralized power plants, the battery pack 15 and the circuit breaker 9 offers the possibility of temporarily islanding the low-voltage network 1. Table IV below is intended to give an idea of possible characteristics for the battery pack 15 used in this particular example:

TABLE IV

| Type (technology) | c-rate | Energy [kWh] |
|---|---|---|
| Lithium Titanate | 1.67 | 60 |

Besides an electric power network, the physical environment within which the method of the invention is implemented must also comprise a monitoring infrastructure. According to the invention, the monitoring infrastructure comprises metering units provided at a selection of nodes of the network. Each metering unit is located at a particular node, and it is arranged to measure the intensity of electrical current flowing through a feeder line into, or out of, that particular node. According to the invention, there may be several metering units arranged at the same node in the network, each of these metering units being arranged to measure the current flowing through a different line (or branch) incident on the same node. (in the following text, nodes of the network that are equipped with at least one metering unit are called "measuring nodes"). According to the presently described exemplary implementation, there is just one metering unit at each measuring node (or more accurately, just one metering unit for each phase of the network). Indeed, as previously mentioned, the exemplary low voltage electric power network 1 illustrated in FIG. 1 is a three-phase electric power network. As far as measuring the electrical currents is concerned, a three-phase electric power network can be considered as a set of three single-phase electric power network. In such a case, a preferred implementation of the invention provides that the current is measured independently for each one of the three phases. This can be accomplished either by using three times as many metering units, or alternatively by using metering units designed for measuring three different phases independently.

FIG. 1 shows the locations of seven different measuring nodes (referenced M1 through M7). However, it should be understood that according to the invention, there could be any number of measuring nodes, possibly as few as two measuring nodes. Furthermore, concerning the particular network illustrated in FIG. 1, it should be understood that the remaining part of the network 1, which is not shown in detail, can possibly comprise additional measuring nodes. The metering units of the nodes M1 through M7 are each arranged for measuring, locally, at least one current, and preferably several different currents. Referring again to FIG. 1, it can be seen that the first measuring node M1 connects the substation transformer with the bus N1. The second measuring node M2 connects the battery pack 15 with the bus N1, the third measuring node M3 connects the PV system G2 with the bus N3, the fourth measuring node M4 connects the PV system G1 with the bus N2, the fifth measuring node M5 connects the diesel generator with the bus N1, the sixth measuring node M6 connects the feeder L2 with the bus N3. Finally, the seventh measuring node M7 connects the feeder L1 with the bus N2.

According to the invention, the monitoring infrastructure further comprises a communication network, to which the metering units are connected so as to allow for the transmission of data to and from a processing unit 7. In the very schematic illustration of FIG. 1, the processing unit 7 is represented in the form of a computer placed at a distance from the network 1. One will understand however that the processing unit could be located at one of the measuring nodes. Indeed, according to a preferred embodiment of the monitoring infrastructure, the processing unit forms a part of one of the metering units. According to the illustrated example, the communication network is not a dedicated transmission network but the commercial GSM network provided by a mobile operator. One will understand however that according to alternative implementations, the communication network for the monitoring infrastructure could be of any type that a person skilled in the art would consider adequate.

Figure 5:
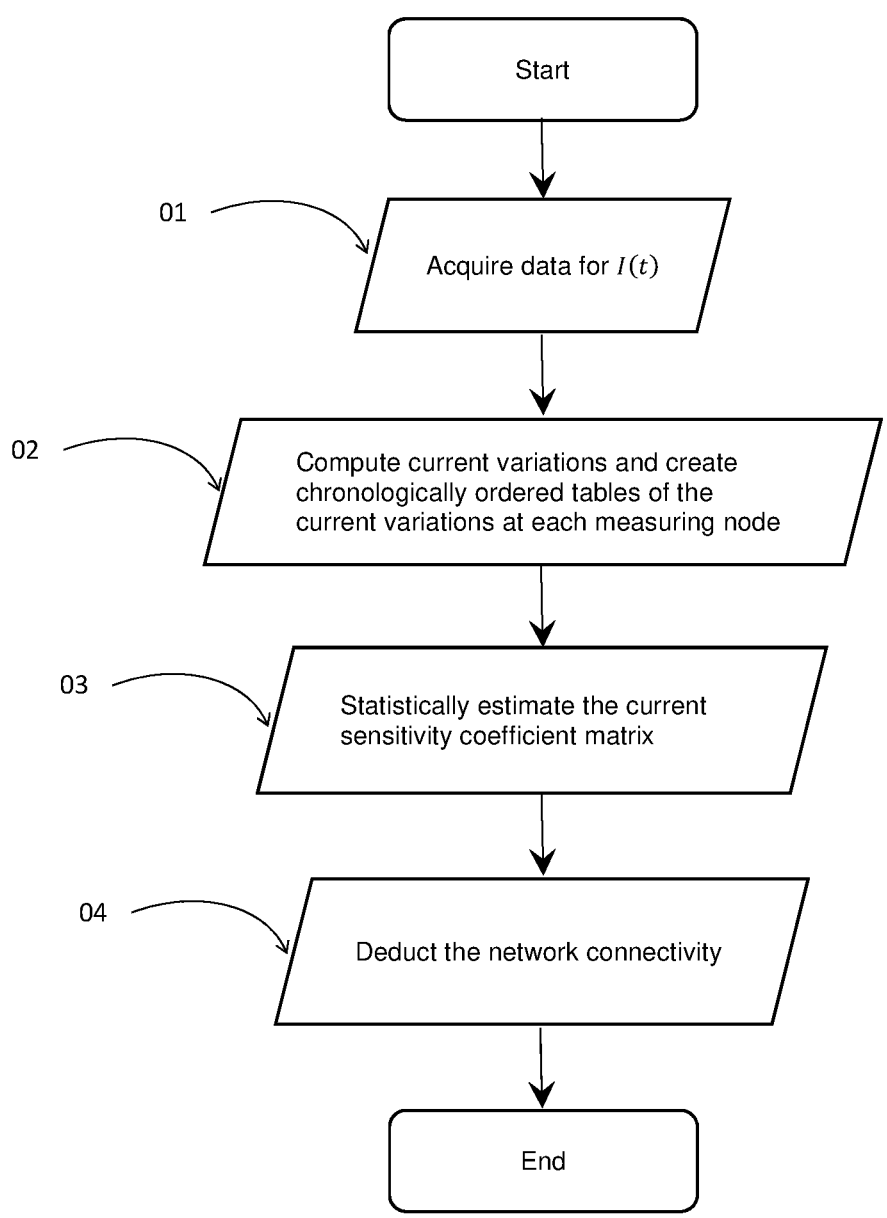
FIG. 5 is a flowchart depicting a first particular implementation of the method of the invention for estimating the topology of an electric power network.

FIG. 5 is a flowchart depicting a first exemplary implementation of the method of the invention for estimating the topology of an electric power network. The particularly undetailed flow chart of FIG. 5 comprises four boxes. The first box (referenced 01) generally represents a task consisting in acquiring a succession of values for the intensity of the electric current flowing through at least one branch, into or out of each one of a plurality of nodes of an electrical power network. For this purpose, the method of the invention uses a monitoring infrastructure arranged to measure branch currents at several locations in the network repeatedly over a time period τ. According to the invention, the electric power network is an AC power network, and, according to most implementations, the measured values for the current are not instantaneous values, but average values (preferably rms values based on the fundamental frequency of the signal) measured over at least a half period of the AC power, preferably over between two and ten periods of the AC power, and most preferred over three periods of the AC power (i.e. during 60 ms in the case of a 50 Hz AC power network). The method of the invention does not require that measurements of different metering units be highly synchronized. However, it does require that the metering units at different measuring nodes provide measurement values obtained approximately at the same time, or in other words it requires that measurements at different measuring nodes be made at times close enough together to allow subsequently treating the obtained values as being concomitant.

According to the presently described implementation of the invention, the different metering units in the network are synchronized by means of the Network Time Protocol (NTP) via the GSM network that serves as the communication network for the monitoring infrastructure. Advantages of NTP are that it is easy to implement and readily available almost everywhere. A known disadvantage of NTP is that it is not extremely precise. However, contrarily to what might be expected, experience shows that the synchronization provided by NTP is good enough for the method of the invention to produce satisfactory results. It should be understood however that NTP is not the only synchronization method usable with the method of the invention. In particular, according to a considerably costlier implementation, the metering units could be PMUs having a permanent link to a common time reference or a GPS synchronization.

According to the invention, measurements of the current made by different metering units are synchronized to the extent discussed above. According to the present example, the metering units measure the current repeatedly, preferably at regular intervals, within a given time window. The number of successive measurements is preferably comprised between 200 and 5000 measurements, preferably between 1000 and 3000 measurements, for instance 2000 measurements. It should be understood however that the optimal number of measurements tends to increase as a function of the number of measuring nodes. On the other hand, the optimal number of measurements tends to decrease with improving accuracy of the measurements provided by the metering units, as well as with improving accuracy of the synchronization between the metering units.

As in the present example, the values measured by the metering units are not instantaneous values, but average values measured over at least half period of the AC power, the minimal time interval between successive measurements should be equal to several periods of the AC power. Actually, according to the first exemplary implementation, the length for the time intervals separating successive measurements is preferably between 60 ms and 3 seconds, and most favorably between 60 ms and 1 second.

The second box (referenced 02) in the flow chart of FIG. 5 represents the task of first computing variations of the measured intensity of the current, based on the data acquired by each one of the metering units arranged at different physical nodes for measuring the electrical current flowing into, or out of, each of said nodes, through at least one branch, and further of compiling tables of the variations of the intensity of the current measured by each one of the metering units in relation to concomitant variations of the intensity of the current measured by all the other metering units. Variations of the intensity of the current can be computed by subtracting from each measured value of the current, the precedent value of the same variable. In other words, if two measurements by the same metering unit are available at times t and t+Δt:

a variation of a branch current $\Delta \tilde{I}_i(t)$ at a point of connection with each measuring node is computed as
$\Delta \tilde{I}i(t) = \tilde{I}i(t+\Delta t) - \tilde{I}i(t)$;
where $i \in \{1, \ldots, N\}$, specifies a metering unit arranged at the i-th measuring node. It should further be noted that, in the present description, quantities that correspond to measurements are denoted with tilde (e.g., $\tilde{I}$).

As previously mentioned, according to considerably costlier implementations of the invention, the metering units could be PMUs having a permanent link to a common time reference or a GPS synchronization. In this case, both the amplitude and the phase of the current are measured. When information about the phase of the current is also available, it can be possible to decrease the number of necessary successive measurements by taking both the modulus and the phase of the current into account. Indeed, in this case, the measured current $I_i(t)$ can be treated as a complex number, and the difference between two consecutive measurements of the current can also be treated as a complex number. In this case, variations of the current $\Delta \tilde{I}_i(t)$ are preferably computed as the modulus of the complex number corresponding to the difference between two consecutive measurements of the current, or in other words, as the magnitude of the difference between two consecutive current phasors.

Returning now to the first exemplary implementation of the invention, one will understand that, in order to compute the current variations, the processing unit first accesses the communication network and downloads the timestamped values for the current $\tilde{I}(t)$ from buffers of the different metering units. The processing unit then computes variations of the measured intensity of the current by subtracting from each downloaded value of the current, the value of the same variable carrying the immediately preceding timestamp. One should keep in mind in particular that the times $t \in \{t_1, \ldots t_m\}$ refer to timestamps provided by different metering units. As, for example, $I_1(t_1)$ and $I_N(t_1)$ were computed from measurements out of different metering units, and that according to the first exemplary implementation their respective clocks were synchronized using NTP, measurements at time t should therefore be understood as meaning measurements at time t± a standard NTP synchronization error.

The processing unit then associates each variation of the measured intensity of the current flowing into, or out of, one particular measuring node through at least one branch $\Delta \tilde{I}_i(t)$ (where $i \in \{1, \ldots, N\}$, specifies a metering unit arranged at the i-th measuring node) with the variations of the intensity of the current measured at the same time (where $t \in \{t_1, \ldots, t_m\}$, stands for a particular measuring time or timestamp) by the metering units arranged at all other measuring nodes. As exemplified by table V (below), the result can be represented as a table, the columns of which correspond to the different metering units arranged at different measuring nodes i, and the lines of which correspond the successive measurement times. These measurement times cover a given time window $\tau = [t_1, t_m]$. According to the invention, m>2N, and preferably m>>N.

TABLE V

| Timestamp | Branch current variation |
|---|---|
| $t_1$ | $\Delta I_1(t_1) \Delta I_2(t_1) \ldots \Delta I_N(t_1)$ |
| $t_2$ | $\Delta I_1(t_2) \Delta I_2(t_2) \ldots \Delta I_N(t_2)$ |
| ... | ⋮ ⋮ ⋮ |
| $t_m$ | $\Delta I_1(t_m) \Delta I_2(t_m) \ldots \Delta I_N(t_m)$ |

The third box (referenced O3) in the flow chart of FIG. 5 represents the task of statistically estimating the current sensitivity coefficients linking the current variations measured by a particular metering unit to the current variations measured by other metering units. The set of current sensitivity coefficients obtained from the data of Table 5 are preferably obtained by means of the Maximum Likelihood Estimation (MLE) method. The current sensitivity coefficients can be grouped in such a way as to form a current sensitivity coefficient matrix. The current sensitivity coefficients linking the current variation measured by one metering unit to concomitant current variations measured by the other metering units can be interpreted as estimations of the values of the partial derivative given hereafter:

$$KII_{ij} \triangleq \frac{\partial I_i}{\partial I_j}$$

According to Maximum Likelihood Estimation, the current sensitivity coefficients of each metering unit with respect to the other units can be obtained as the result of following optimization problem or its convex reformulation:

$$\min_\Omega \sum_{i \neq j'} \sum_t \| \Delta I(t)_i - \widehat{\Delta I}(t)_i \|_n$$

s.t. (next page)

$$\widehat{\Delta I}(t)_i = \sum_{i \neq j} (\widehat{\Delta I}(t)_i KII_{i,j})$$

where $\Delta I(t)_i$ is the measured current variation and $\widehat{\Delta I(t)}_i$ is the estimated current variation without noise, and $\Omega = \{ \widehat{\Delta I}(t)_i, KII_{i,j} \}$.

The current sensitivity coefficient of a metering unit with respect to itself is equal to 1, i.e. $KII_{i,i}=1$. If the current sensitivity coefficients of a branch is calculated with respect to all branches including the branch itself, the coefficient with respect to the branch itself becomes equal to 1 and the coefficients with respect to other branches become negligible, because the correlation between a time series of data and itself is equal to 1. In other words, every metering unit has the highest sensitivity coefficients with respect to its own measurement rather than the others. In order to determine the current sensitivity coefficients of a metering unit with respect to the other metering units, the measured current variation of the branch for which the coefficients are calculated should be excluded from $\Delta I(t)_i$ in the estimation. For instances, $KII_{i,j}$ for metering unit j is calculated by excluding j-th column from $\Delta I(t)_i$ (i.e. $\Delta I_{i \neq j}(t)$) and the $KII_{i,j}$ is considered to be equal to 1.

Due to the statistical nature of the method, individual measured values tend to deviate to some extent from their predicted value. Accordingly, each measured current variation equals the corresponding estimated current variation plus/minus an error term. That is:

$\Delta \tilde{I}_i = \Delta I_i \pm \omega_i(t)$, where with $\omega_i(t)$ is the error term.

According to the invention, the Maximum Likelihood Estimation (MLE) takes negative first-order autocorrelation into account. This means that the MLE assumes that a substantial negative correlation exists between the errors with $\omega_i(t)$ and with $\omega_i(t+\Delta t)$, where t and t+$\Delta t$ are two consecutive time-steps. In the present description, the expression a "substantial correlation" is intended to mean a correlation, the magnitude of which is at least 0.3, is preferably at least 0.4, and is approximately equal 0.5 in the most favored case.

According to preferred implementations of the invention, the MLE further assumes that no substantial correlation exists between the errors from two non-consecutive timesteps. The expression "no substantial correlation" is intended to mean a correlation, the magnitude of which is less than 0.3, preferably less than 0.2, and approximately equal to 0.0 in the most favored case. Accordingly, the correlation between the errors in two non-consecutive time steps is contained in the interval between −0.3 and 0.3, preferably in the interval between −0.2 and 0.2, and it is approximately equal to 0.0 in the most favored case. As the number of successive measurements is m, there are m−1 error terms with $\omega_i(t)$ for each metering unit, and therefore (m−1)×(m−1) error correlation terms.

The fourth box (referenced O4) in the flow chart of FIG. 5 represents the task of deriving the network connectivity from the current sensitivity coefficient matrix obtained in the previous step. The determination of the connectivity is based on the general principle that the metering unit that is the most sensitive to the variations of the current measured by another metering unit, flowing into, or out of, a particular node through at least one branch, is the one that is arranged at the node immediately upstream of that particular node. In other words, in a distribution network, the large current sensitivity coefficients (e.g. close to 1) indicate the nodes that are directly or indirectly located upstream.

Figure 6:
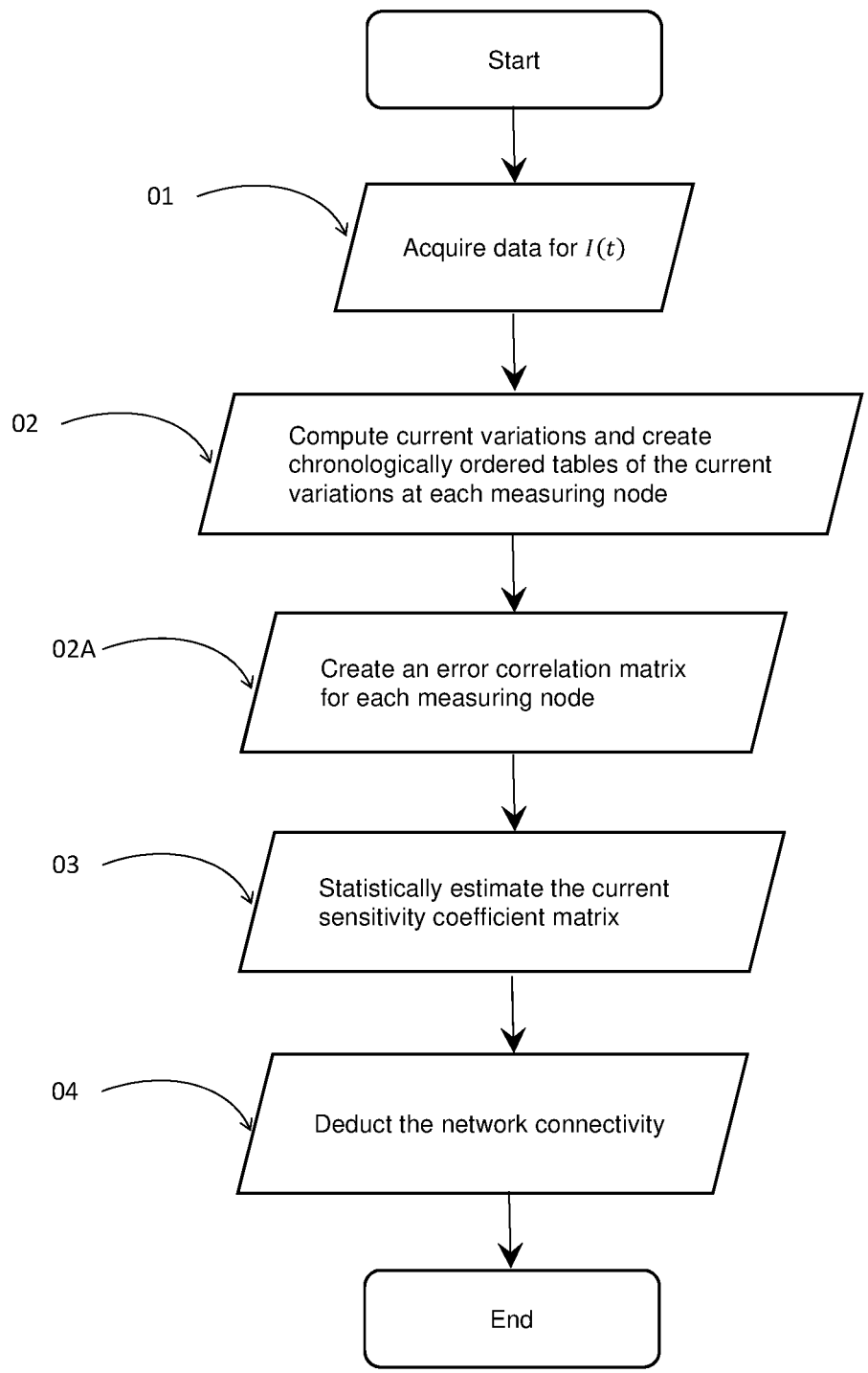
FIG. 6 is a flowchart depicting a second particular implementation of the method of the invention.

FIG. 6 is a flowchart depicting a particular variant of the implementation illustrated by the flowchart of FIG. 5. According to the illustrated variant, the Multiple Likelihood Estimation is implemented in the form of multiple linear regression. To be even more specific, the particular type of multiple linear regression that is implemented is "generalized least squares". The generalized least squares method allows obtaining the current sensitivity coefficients analytically through the resolution of the following equation for each metering unit arranged at a measuring node i∈ {1, . . . , N}:

$$KII_{i\neq j,j}=((\Delta I(t_m)_{i\neq j})^T \Sigma_{m,m}^{-1} \Delta I(t_m)_{i\neq j})^{-1} (\Delta I(t_m)_{i\neq j})^T \Sigma_{m,m}^{-1} \Delta I(t_m)_j$$

$$KII_{j,j}=1$$

where $\Delta I(t_m)_i$ is the current variations of i-th branch for time instant m and $\Sigma_{m,m}$ is the correlation matrix for taking the impact of measurement noise into account with first order autocorrelation.

The results of the generalized least square multiple linear regression method is the same as the Maximum Likelihood Estimation (MLE) if the error, i.e. $\omega_i(t)$, follows a multivariate normal distribution with a known covariance matrix. The error correlation matrices $\Sigma_{m,m}$ are preferably not preloaded into the processing unit, but created only once the table of the variations of the measured current (Table V) has been created (box 02). Indeed, the size of the (m−1) by (m−1) error correlation matrices is determined by the length m−1 of the table of the variations of the measured current. Accordingly, the variant of FIG. 6 comprises an additional box 02A not present in FIG. 5. Box 02A comprises the task of creating the error correlation matrix for the metering unit arranged at each measuring node. The presence of this additional box after box 02 has the advantage of allowing for adapting the method to the case where the set of data associated with one particular timestamp is missing.

In the present example, as is the case with any correlation matrix, the entries in the main diagonal of each one of the N(m−1) by (m−1) correlation matrices are all chosen equal to 1. According to the invention, the entries in both the first diagonal below, and the first diagonal above this, are all comprised between −0.7 and −0.3, and finally all other entries are comprised between −0.3 and 0.3. In the present particular example, the correlation coefficients of the errors between two non-consecutive time-steps are equal to zero, and the correlation coefficients of the errors between two consecutive time-steps are assumed to be −0.5. In this case the error correlation matrices correspond to the tridiagonal matrix shown below:

$$\Sigma = \begin{pmatrix} 1 & -0.5 & & & \\ -0.5 & \ddots & \ddots & 0 & \\ & \ddots & \ddots & \ddots & \\ & 0 & \ddots & \ddots & -0.5 \\ & & & -0.5 & 1 \end{pmatrix}$$

Figure 7:
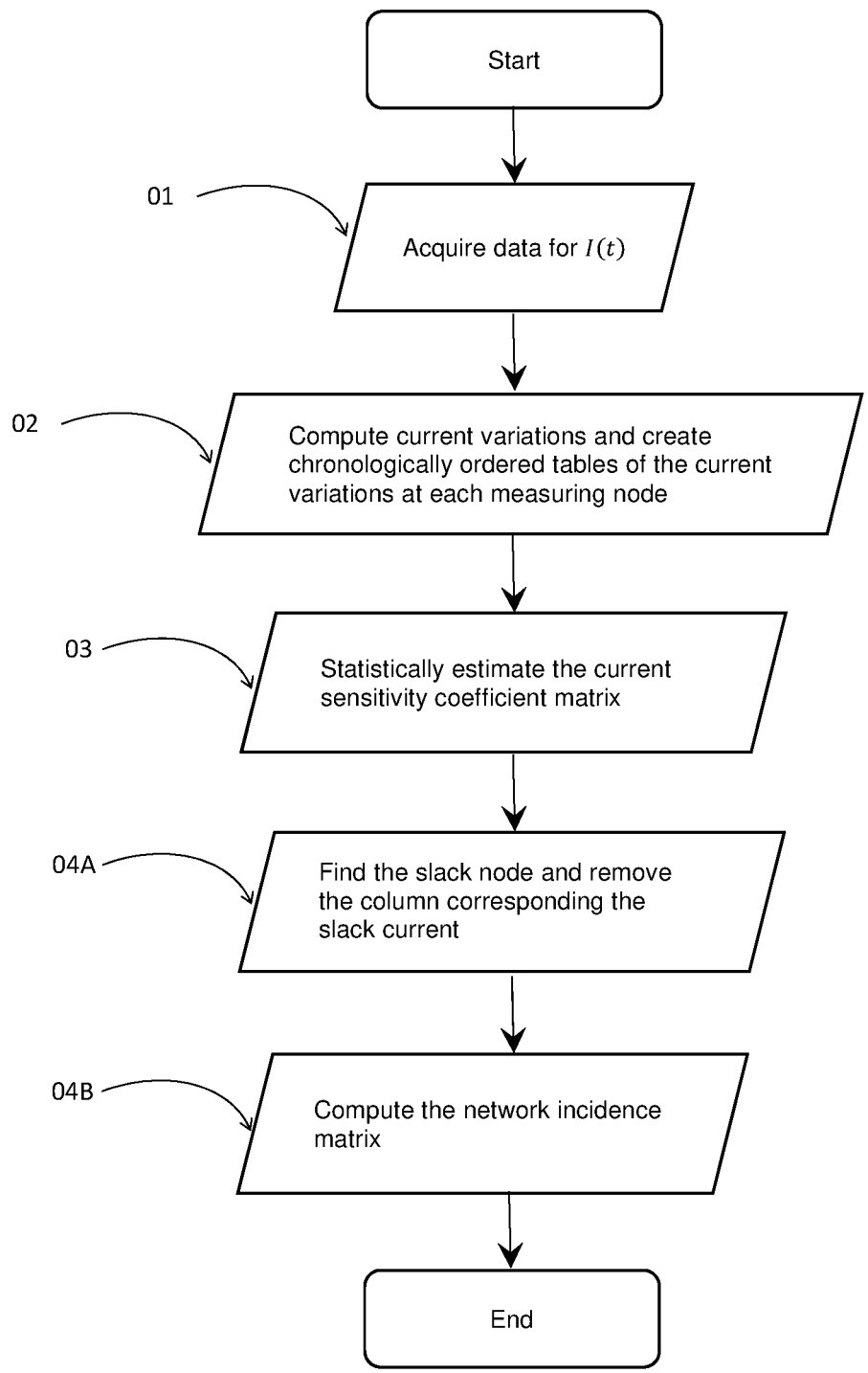
FIG. 7 is a flowchart depicting a third particular implementation of the method.

FIG. 7 is a flowchart depicting another particular variant of the implementation illustrated by the flowchart of FIG. 5. According to the variant of FIG. 7, the step of deducting the network connectivity from the current sensitivity coefficient matrix, given by $KII_{i,j}$, (step [04] in FIG. 5) is decomposed into two different steps ([04A] and [04B]). Step [04A] is devoted to "finding the slack node and to removing the column corresponding to the slack current from the absolute sensitivity matrix". Step [04B] for its part is devoted to "computing the network incidence matrix". The variant illustrated in FIG. 7 assumes that a metering unit is installed at the slack node. The slack node can be the low voltage side of the transformer that connects the network, to which the method of the invention is being applied, to the higher voltage network. In the case of a transformer as the slack node, the transformer current is considered as the slack branch current. The slack branch is therefore upstream from the slack node. This assumption in radial networks implies that the number of nodes (N) is equal with the number of branches within the network plus 1, where 1 represents the metering unit measuring the slack current. It should be noted that for radial networks the network incidence matrix is N×(N−1) matrix, where the number of rows shows the number of nodes including the slack node and the number of columns indicates the number of lines excluding the slack branch.

Box [04A] in FIG. 7 can be implemented by the following procedure:
a) create the "absolute current sensitivity matrix" by replacing each coefficient $KII_{i,j}$ of the current sensitivity matrix by its absolute value;
b) sum the elements of each column of the absolute current sensitivity matrix and save the results in a row vector $C_{1\times N}$. Similarly, sum the elements of each row of the absolute current sensitivity matrix and save the results in a column vector of $R_{N\times 1}$. Then, calculate the "slack node indicator vector" $S_{N\times 1}$ as follows:

$$S_{N\times 1}=R_{N\times 1}/(C_{1\times N})^T$$

c) find the component of the slack node indicator vector with the highest value. The index of this component, shown by i, indicates the metering unit at the slack node. The corresponding column in the absolute current sensitivity matrix shows the slack branch. It is due to the fact that current variations in all branches of the network are observed by the metering unit of the slack node, whereas the current variations at the slack node are not observed by the other metering units throughout the network;

Box [04B] in FIG. 7 can be implemented by the following procedure:
a) take the absolute current sensitivity matrix, and for each column "i" of this matrix and for j≠i identify the element with the largest value and set this element equal to 1, and further replace the value of the element $\widehat{KII}_{i,i}$ of the same column by the value 1. Finally set the value of other elements in each column equal to 0. The result of these transformations gives a matrix Â corresponding to the expression below:

$$\hat{A}_{i,j} = \begin{cases} 1 & \forall\, j \neq i\,|\, j = \mathrm{argmax}(KII_{i,j}) \\ 1 & i = j \\ 0 & \text{else} \end{cases}$$

(each column of $\hat{A}_{i,j}$ has two non-zero elements).
b) remove from the N×N matrix Â the column having the index "j" corresponding to the index of the slack branch in step [04A]. The resulting N×(N−1) matrix is the network incidence matrix. As noted above, each column has two non-zero elements. These two elements indicate the two nodes on which the branch corresponding to a particular column is incident.

It is important to note that steps 04A and 04B are not necessarily implemented successively as described above. Furthermore, removing one column from an N×N matrix in order to obtain an N×(N−1) could alternatively be done before replacing the current sensitivity coefficients by 1 and 0 to create the matrix A.

Example I

Figure 8:
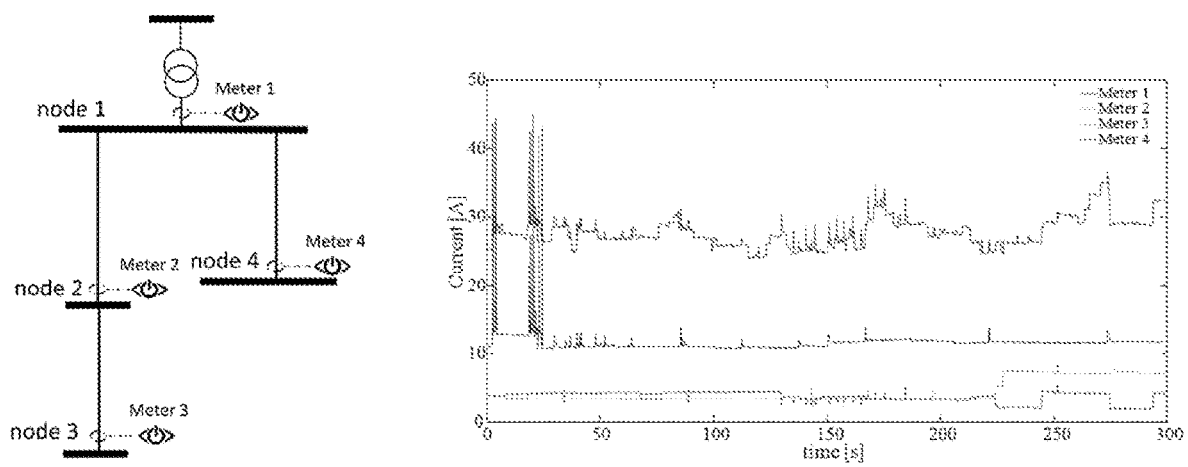
FIG. 8 shows a first example of measured current data used to estimate the topology of a network by means of the method of the invention.

The appended FIG. 8 shows the single-line diagram of a network with four metering units (left side) and the timestamped current measurements from every metering units (right side). The corresponding current sensitivity coefficient matrix is calculated by means of generalized least squares multiple linear regression as explained above. The computed current sensitivity coefficient matrix is the following:

$$KII = \begin{bmatrix} 1.0000 & 0.7807 & 0.7542 & 0.5854 \\ 0.1142 & 1.0000 & 1.2004 & -0.0489 \\ 0.0096 & 0.1039 & 1.0000 & 0.0005 \\ 0.5111 & -0.2918 & 0.0378 & 1.0000 \end{bmatrix}$$

Note that the diagonal elements, given in bold digits indicate each meter's coefficient with respect to itself and is equal to 1.

The "slack node indicator vector" of the absolute current sensitivity matrix is:

$$S_{4\times 1} = \begin{bmatrix} 1.9086 \\ 1.0860 \\ 0.3723 \\ 1.1259 \end{bmatrix}$$

The slack node indicator vector shows that "Meter 1" is connected to the slack node (i.e. node 1). Thus, the first column is removed from the current sensitivity matrix KII. The reduced 4×3 matrix is given below where the maximum sensitivity coefficient at each column, regardless of the meter's coefficient with respect to itself, is shown in bold digits. For instance, column 1 shows that the highest sensitivity coefficient is between "Meter 2" and "Meter 1" indicating the physical connectivity between these two nodes. Similar observations can be made by looking at column 2 for connectivity between "Meter 3" and "Meter 2", and by looking at column 3 for connectivity between "Meter 4" and "Meter 1":

$$\begin{bmatrix} 0.7807 & 0.7542 & 0.5854 \\ 1.0000 & 1.2004 & -0.0489 \\ 0.1039 & 1.0000 & 0.0005 \\ -0.2918 & 0.0378 & 1.0000 \end{bmatrix}$$

The elements indicated with bold digits correspond to the non-zero elements in the network incidence matrix ($A_{i,j}$):

$$A_{i,j} = \begin{bmatrix} 1 & 0 & 1 \\ 1 & 1 & 0 \\ 0 & 1 & 0 \\ 0 & 0 & 1 \end{bmatrix}$$

Example II

Figure 9:
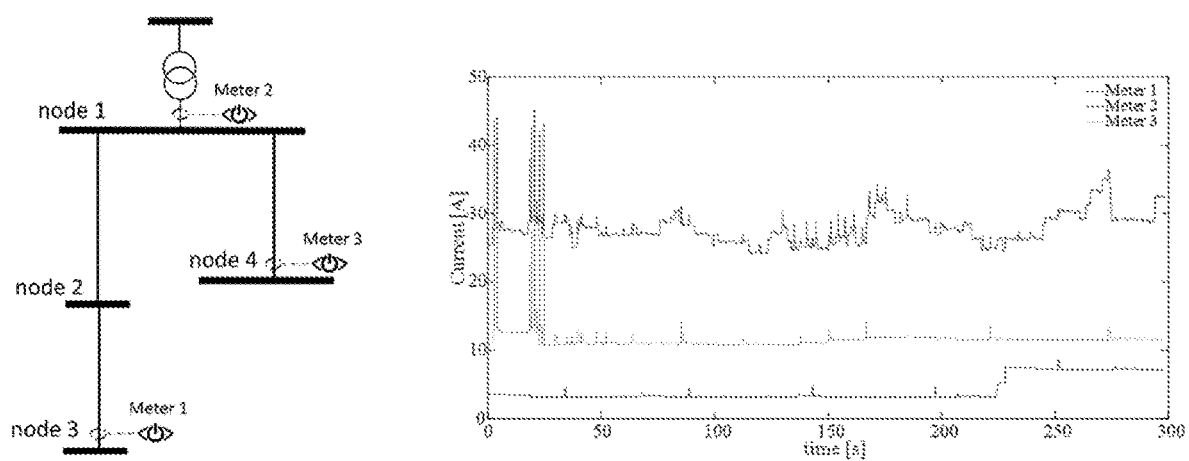
FIG. 9 shows a second example of measured current data used to estimate the topology of a network by means of the method of the invention.

The appended FIG. 9 shows the same network as FIG. 8. However, the network is only provided with three metering devices. Note that in this case, a different numbering order is selected for the meters, in other words "Meter 1", "Meter 2", and "Meter 3" are placed at node 3, node 1, and node 4, respectively. In this case, the resulted current sensitivity coefficients are given in following matrix. In this case, the resulted current sensitivity coefficients are given in following matrix:

$$KII = \begin{bmatrix} 1.0000 & 0.0245 & -0.0052 \\ 1.8569 & 1.0000 & 0.6008 \\ -0.3170 & 0.4846 & 1.0000 \end{bmatrix}$$

The "slack node indicator vector" of the absolute current sensitivity matrix is:

$$S_{3\times 1} = \begin{bmatrix} 0.3244 \\ 2.2912 \\ 1.1218 \end{bmatrix}$$

It indicates that "Meter 2" is connected to the slack node (i.e. node 1). Thus, the second column is removed from the current sensitivity matrix. The reduced 3×2 matrix is given below where the maximum sensitivity coefficient at each column, regardless of the meter's coefficient with respect to itself, is shown in bold digits:

$$\begin{bmatrix} 1.0000 & -0.0052 \\ 1.8569 & 0.6008 \\ -0.3170 & 1.0000 \end{bmatrix}$$

Thus, the network incidence matrix is given at the top of next page:

$$\begin{bmatrix} 1 & 0 \\ 1 & 1 \\ 0 & 1 \end{bmatrix}$$

Column 1 shows the physical connectivity between "Meter 1" and "Meter 2" and column 2 shows the physical connectivity between "Meter 3" and "Meter 2". The results of Example 2 interestingly demonstrates that the developed algorithm is capable to identify the physical connectivity between a plurality of measuring nodes, even in the case where the metering devices are not placed at all the network nodes or in the case of different numbering order for metering device.

Example III

As previously discussed, the network topology can be also inferred from the current-power sensitivity coefficients. This alternative current-power method is outlined below. It requires that:

the electric power network comprise a set of metering nodes (N11, ..., N14, see FIG. 10) comprising a slack node (N11) and other metering nodes (N12, ..., N14), a slack branch (20) connected to the slack node, and a set of other branches (A, B, C) arranged for connecting the metering nodes one to another, and the electric power network further being provided with a monitoring infrastructure comprising means for measuring the voltage of each one of said measuring nodes, wherein the means for measuring comprises metering units (M11, ..., M17), one (M11) of the metering units being arranged for measuring the electric current flowing into, or out of, the slack node (N11) through the slack branch (20), and each one of said measuring nodes further being provided with metering units (M12, . . . , M17) for measuring the electric current flowing into or out of said one of said measuring node through each one of said other branches (A, B, C) that is incident on said one measuring of node, the monitoring infrastructure comprising a processing unit (7) connected to a communication network, the metering units being connected to the communication network so as to allow for data transmission to and from the processing unit;

and the current-power method comprises the steps of:
I. monitor the voltage of each one of said measuring nodes (N11, . . . , N14) and have the metering units (M11, . . . , M17) measure at the same time, repeatedly over a time window (τ), current intensity values I(t), and timestamp t∈{t$_1$, . . . , t$_m$} the current intensity values;
II. compute for each measuring node (N11, . . . , N14) the nodal power P$_i$; and further compute variations $\Delta \tilde{P}_i(t)$ of the nodal power of each one of said measuring nodes by subtracting from each nodal power value the precedent nodal power value;
III. compute variations $\Delta I_i(t)$ of the current intensity measured by at least one of said metering units provided at each one of said measuring nodes, by subtracting from each current intensity value the precedent current intensity value measured by the same metering unit, and compile chronologically ordered tables of the variations of the current intensity $\Delta I_i(t)$ at each one of said measuring nodes (N11, . . . , N14) in relation to concomitant variations of the nodal power ($\Delta \tilde{P}_{11}$(t), . . . , $\Delta \tilde{P}_{14}$(t)) at all measuring nodes;
IV. perform a Maximum Likelihood Estimation (MLE) of the current-power sensitivity coefficients KIP$_{i,j}$ linking current variations $\Delta I_i(t)$ measured at each measuring node (N11, . . . , N14) to the nodal power variations $\Delta P_j(t)$ at all measuring nodes as compiled during step III, while taking into account negative first-order serial correlation between error terms corresponding to discrepancies between the actual current variations ($\Delta I_i(t)$) and the variations predicted by the Maximum Likelihood Estimation, and obtain a current-power sensitivity coefficient matrix KIP$_{i,j}$;
V. compute the network incidence matrix $A_{N \times (N-1)}$ from the current-power sensitivity coefficients estimated in step IV.

According to a preferred implementation of the current-power method, step V comprises the following sub-steps:
a. obtain the "absolute current-power sensitivity matrix" by assigning to each element of the current-power sensitivity coefficient matrix the modulus of the estimated value of the corresponding element;
b. for each column of the absolute current-power sensitivity matrix, identify the non-diagonal element with the largest value and assign the value 1 to this element, further assign the value 0 to all other non-diagonal elements, in such a way as to obtain a square "binary current-power sensitivity matrix" with exactly two non-zero elements in each column by further assigning to each diagonal element the value 1;
c. determine the position of the row and of the column of the matrix obtained in step IV corresponding to said first metering unit by computing a first (C) and a second (R) vector, the components of which are equal to the sum of the elements respectively in each column and in each row of the matrix; and by further computing a third vector (S), the components of which are obtained by dividing each component of the second vector (R) by the corresponding component of the first vector (C), the position in the matrix obtained in step IV of the row and of the column corresponding to said first metering unit can then be determined by identifying the component of the third vector (S) having the highest value;
d. remove the column corresponding to the first metering unit from the binary current-power sensitivity matrix obtained in step V, so as to obtain the network incidence matrix with two non-zero elements in each column indicating the two nodes on which each particular branch (except the slack branch) is incident.

Figure 10:
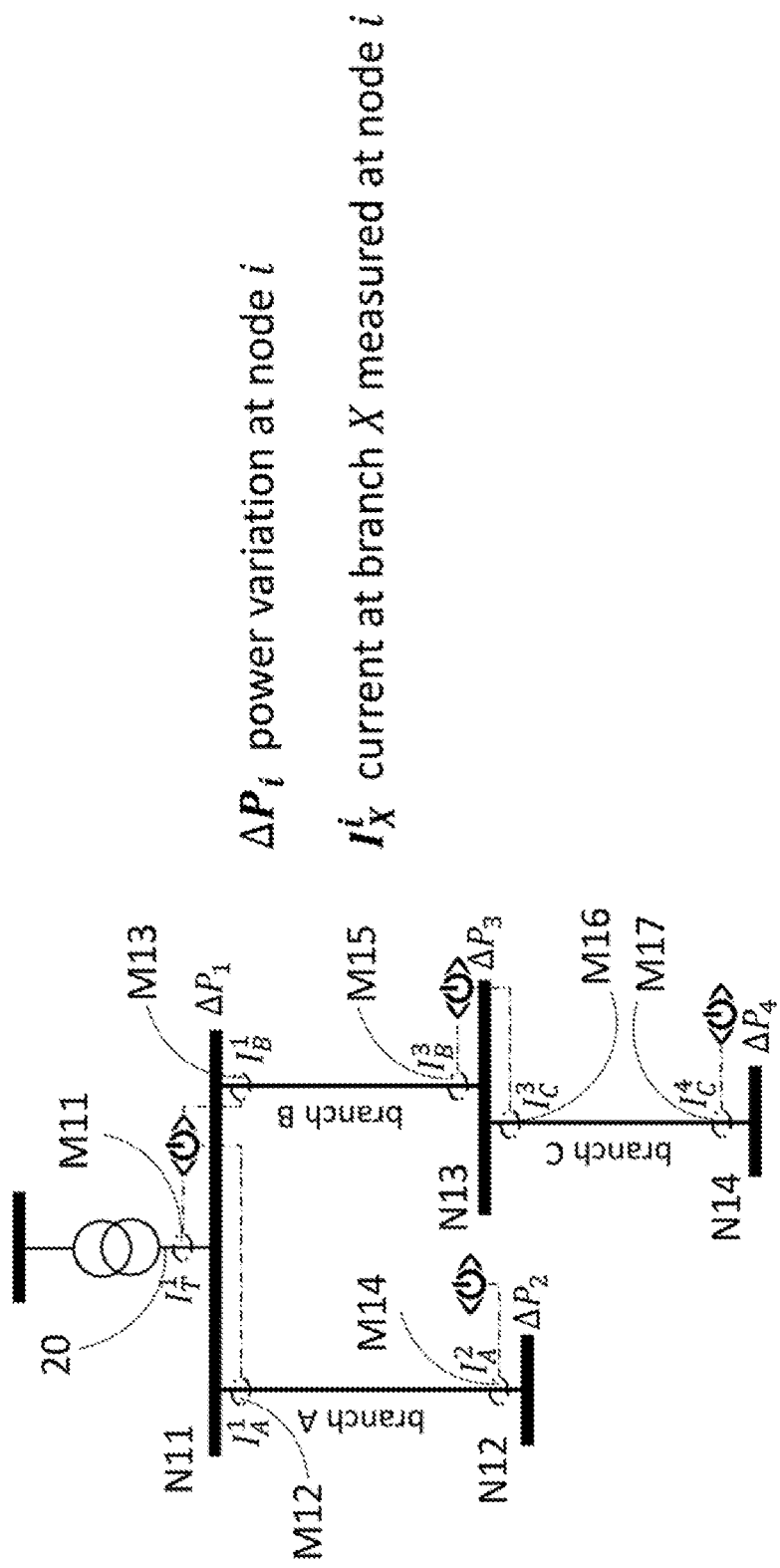
FIG. 10 shows a particular allocation of metering devices usable for calculating the nodal power variations for the electrical network already illustrated in FIGS. 2 and 3.

FIG. 10 shows a single-line diagram of the same network also shown in FIGS. 8 and 9. However, each node of the network illustrated in FIG. 8 is equipped with a single metering unit and there are therefore four metering units in the entire network, while there are seven metering units in the network as illustrated in FIG. 10. The additional metering units in FIG. 10 are needed to calculate the nodal power. Three metering units are located at node 1, two metering units are located at node 3, and one metering unit is located at each one of nodes 2 and 4. The nodal power at "node i" (P$_i$) can be computed as:

$$\underline{P_i} = \underline{U_i} \cdot \Sigma_k (\underline{I_k} \cos \varphi_k)$$

where Ui is the voltage of node i, I$_k$ is the current flowing through branch k incident on node i, and φ$_k$ is the phase angle between the current in branch k and the voltage.

The next step is to compute variations, $\Delta \tilde{P}_i(t)$, of the nodal power at each node, as well as concomitant variations, $\Delta \tilde{I}_i(t)$, of the measured current through at least a selection of the branches of the network, and to compile tables of the variations of the current through each one of the selected branches in relation to concomitant variations of the power at all the nodes. As previously mentioned, this example uses 7 metering units to monitor the network.

The coefficients of the corresponding current-power sensitivity matrix can be interpreted as estimations of the values of the partial derivative given hereafter:

$$KIP_{ij} \triangleq \frac{\partial I_i}{\partial P_j}$$

As explained above, the coefficients can be calculated by means of generalized least squares multiple linear regression as explained above. The regression analysis allows predicting the values of the variations of the intensity of the current measured by all seven metering units. However, as the previous examples never had more than a single metering unit arranged at any given node, we choose to apply the multiple parametric regression analysis in such a way as to predict only the variations affecting the intensity of the current measured by a selection of four metering units; each of the selected metering unit being located at a different node. In the present example, for each node, we selected the metering unit arranged to measure the current flowing into, or out of, said node through the branch arranged upstream from the node. Accordingly, the computed current-power sensitivity coefficient matrix is the following:

$$KIP = \begin{bmatrix} 3.7684 & 3.7661 & 3.7689 & 3.7708 \\ 0.0003 & 1.7439 & 1.7437 & 0.0003 \\ 0.0004 & 0.0027 & 3.9548 & 0.0004 \\ 0.0010 & 0.0010 & 0.0010 & 3.9709 \end{bmatrix}$$

The element in i-th row and j-th column shows current variations of i-th metering unit with respect to power variations of j-th column. For instance, the large values of $KIP_{1,4}=3.7708$ and of $KIP_{4,4}=3.9709$ show that the power variations at node 4 affects the intensity of the currents measured by metering units 1 and 4. Whereas, the power variations at node 4 are not observed and do not substantially affect the intensity of the currents measured by metering units 2 and 3, ($KIP_{2,4}=0.0003$ and $KIP_{3,4}=0.0004$).

Although the method of the invention has been illustrated and described in greater detail by means of exemplary implementations, the invention is not restricted by the disclosed examples and various alterations and/or improvements could be derived therefrom by a person skilled in the art without departing from the scope of the present invention defined by the annexed claims.

1—REFERENCES

[1] T. Erseghe and S. Tomasin, "Plug and Play Topology Estimation via Powerline Communications for Smart Micro Grids," *IEEE Transactions on Signal Processing*, vol. 61, no. 13, pp. 3368-3377, 2013.

[2] L. Lampe and M. O. Ahmed, "Power Grid Topology Inference Using Power Line Communications," in *IEEE International Conference on Smart Grid Communications*, Vancouver, 2013.

[3] M. O. Ahmed and L. Lampe, "Power Line Communications for Low-Voltage Power Grid Tomography," *IEEE Transactions on Communications*, vol. 61, no. 12, pp. 5163-5175, 2013.

[4] J. Bamberger, C. Hoffmann, M. Metzger and C. Otte, "Apparatus, method, and computer software for detection of topology changes in electrical networks". WO Patent WO 2012031613 A1, 15 Mar. 2012.

[5] E. G. de Buda and J. C. Kuurstra, "System for Automatically Detecting Power System Configuration". US Patent US 20100007219 A1, 14 Jan. 2010.

[6] S. Bolognani, N. Bof, D. Michelotti, R. Muraro and L. Schenato, "Identification of power distribution network topology via voltage correlation analysis," in *52nd IEEE Conference on Decision and Control*, Florence, 2013.

[7] B. Nicoletta, M. Davide and M. Riccardo, "Topology Identification of Smart Microgrids," 2013.

[8] M. H. Wen, R. Arghandeh, A. von Meier, K. Poolla and V. O. Li, "Phase Identification in Distribution Networks with micro-synchrophasors," in *IEEE Power & Energy Society General Meeting*, Denver, 2015.

[9] D. Deka, S. Backhaus and M. Chertkov, "Estimating Distribution Grid Topologies: A Graphical Learning based Approach," in *Power Systems Computation Conference*, Genova, 2016.

[10] R. Sonderegger, "Smart grid topology estimator". United States Patent US 2015/0241482 A1, 27 Aug. 2015.

[11] J. L. Kann, "Grid topology mapping with voltage data". United States Patent US 2016/0109491 A1, 21 Apr. 2016.

[12] X. Li, H. V. Poor and A. Scaglione, "Blind Topology Identification for Power Systems," in *IEEE International Conference on Smart Grid Communications*, Vancouver, 2013.

[13] V. Arya, T. S. Jayram, S. Pal and S. Kalyanaraman, "Inferring connectivity model from meter measurements in distribution networks," *E-Energy*, pp. 173-182, 2013.

[14] S. Jayadev, N. Bhatt, R. Pasumarthy and A. Rajeswaran, "Identifying Topology of Power Distribution Networks Based on Smart Meter Data," in https://arxiv.org/pdf/1609.02678, 2016.

[15] "Grid diagram creation and operation control". United States Patent US 2015/0153153 A1, 4 Jun. 2015.

[16] V. Arya and R. Mitra, "Voltage-based clustering to infer connectivity information in smart grids". US Patent US20150052088A1, 19 Feb. 2015.

[17] J. Bickel and R. Carter, "Automated hierarchy classification in utility monitoring systems". US Patent US 20070005277 A1, 4 Jan. 2007.

[18] O. Xu, B. Geisser, A. Brenzikofer, S. Tomic and M. Eisenreich, "Verfahren und einrichtung zur bestimmung der topologie eines stromversorgungsnetzes". Europe Patent EP 3065250 A1, 7 Sep. 2016.

[19] V. Arya, S. Kalyanaraman, D. P. Seetharamakrishnan and J. Thathachar, "Determining a connectivity model in smart grids". US Patent US 20140039818 A1, 6 Feb. 2014.

[20] F. Kupzog and A. Lugmaier, "Method for ascertaining parameters for power supply systems, and system for carrying out the method". WO Patent WO 2013026675 A1, 28 Feb. 2013.

[21] "Estimation Method of Distribution Network structure mixed integer quadratic programming Model". China Patent CN 104600699 B, 17 Aug. 2015.

"Branch active power flow-based power network topology error identification method". China Patent CN 201510973479, 23 Dec. 2015.

[23] M. Coyne, N. Jespersen, P. Sharma, S. Srinivasan and L. Sheung Yin Tse, "Historic storage of dual layer power grid connectivity model". US Patent US 20120089384 A1, 12 Apr. 2012.

[24] Y. Sharon, A. Annaswamy, M. A. Legbedji and A. Chakraborty, "Topology identification in distribution network with limited measurements". US Patent US 20130035885 A1, 7 Feb. 2013.

[25] E. G. De Buda, "System for accurately detecting electricity theft". Canada Patent CA2689776, 12 Jul. 2010.

[26] P. Deschamps and M.-C. Alvarez-Herault, "Method and device for determining the structure of a power grid". Europe Patent EP2458340 A2, 30 May 2012.

[27] V. Gouin, M.-C. Alvarez-Herault, P. Deschamps, S. Marié and Y. Lamoudi, "Procéde´ et système de détermination de la structure d'un réseau de distribution d'électricitéet programme d'ordinateur associé". Europe Patent EP 3086093 A1, 26 Oct. 2016.

[28] V. Kekatos, G. B. Giannakis and R. Baldick, "Online Energy Price Matrix Factorization for Power Grid Topology Tracking," IEEE Transactions on Smart Grid, vol. 7, no. 3, pp. 1239-1248, 2016.

[29] J. Kussyk, "Low voltage distribution system and method for operating the same", US Patent US 20140032144 A1, 30 Jan. 2014.

What is claimed:

1. A method for identifying the topology of an electric power network (1), the electric power network comprising a slack node (N1), a set of other nodes (N2, . . . , N3), a slack branch (10) connected to the slack node, and a set of other branches (L1, L2) arranged for connecting the slack node and the other nodes one to another, and the electric power network further being provided with a monitoring infrastructure comprising metering units (M1, . . . , M7), one (M1) of the metering units being arranged for measuring the electric current flowing into, or out of, the slack node (N1) though the slack branch (10), and the other metering units (M2, . . . , M7) each being arranged for measuring the electrical current flowing into, or out of, one of said nodes through at least one of said other branches, the monitoring infrastructure comprising a processing unit (7) connected to a communication network, the metering units being connected to the communication network so as to allow for data transmission to and from the processing unit, the method comprising the steps of:

- I. have the metering units (M1, . . . , M7) measure at the same time, repeatedly over a time window ($\tau$), current intensity values I(t), and timestamp $t \in \{t_i \ldots, t_m\}$ the current intensity values;
- II. compute variations $\Delta I_i(t)$ of the current intensity measured by each metering unit, by subtracting from each current intensity value the precedent current intensity value, and compile chronologically ordered tables of the variations of the current intensity measured by each metering unit (M1, . . . , M7);
- III. perform a Maximum Likelihood Estimation (MLE) of the current sensitivity coefficients $KII_{i,j}$ linking current variations $\alpha I_i(t)$ measured by each metering unit (M1, . . . , M7) to the current variations $\Delta I_j)(t)(j \neq i)$ measured by the other measuring units as compiled during step II, while taking into account negative first-order serial correlation between error terms corresponding to discrepancies between the actual current variations ($\Delta I_i(t)$) and the variations predicted by the Maximum Likelihood Estimation, and obtain from the estimated current sensitivity coefficients $KII_{i,j}$ a current sensitivity coefficient matrix;
- IV. compute the network incidence matrix $A_{N \times (N-1)}$ from the current sensitivity coefficients estimated in step III based on the general assumption that the metering unit that is the most sensitive to the variations of the measured current in a branch connected to a particular node is the metering unit that is arranged at the physical node immediately upstream form said particular node.

2. The method for identifying the topology of an electric power network (1) according to claim 1, wherein said other metering units (M2, . . . , M7) are each arranged for measuring the electrical current flowing into, or out of, a different one of said other nodes through at least one of said other branches.

3. The method for identifying the topology of an electric power network (1) according to claim 1, wherein step IV comprises the following sub-step of:

- A. for each column "j" of the current sensitivity coefficient matrix (KII), identify the non-diagonal element ($KII_{\delta \neq i,j}$) with the largest absolute value, assign the value 1 to this element, and assign the value 1 also to the diagonal element ($KII_{j,j}$), further assign the value 0 to all other non-diagonal elements.

4. The method for identifying the topology of an electric power network (1) according to claim 3, wherein step IV also comprises the sub-step of:

- B. finding the slack node and removing the column corresponding to the slack current from the current sensitivity coefficient matrix.

5. The method for identifying the topology of an electric power network (1) according to claim 1, wherein step IV comprises the following sub-steps:

- a. obtain the "absolute current sensitivity matrix" by assigning to each element of the current sensitivity coefficient matrix the modulus of the estimated value of the corresponding element;
- b. for each column of the absolute current sensitivity matrix, identify the non-diagonal element with the largest value and assign the value 1 to this element, further assign the value 0 to all other non-diagonal elements, in such a way as to obtain a square "binary current sensitivity matrix" with exactly two non-zero elements in each column;
- c. determine the position of the row and of the column of the matrix obtained in step IV corresponding to said first metering unit by computing a first (C) and a second (R) vector, the components of which are equal to the sum of the elements respectively in each column and in each row of the matrix; and by further computing a third vector (S), the components of which are obtained by dividing each component of the second vector (R) by the corresponding component of the first vector (C), the position in the matrix obtained in step IV of the row and of the column corresponding to said first metering unit can then be determined by identifying the component of the third vector (S) having the highest value;
- d. remove the column corresponding to the first metering unit from the binary current sensitivity matrix obtained in step V, so as to obtain the network incidence matrix with two non-zero elements in each column indicating the two nodes on which each particular branch (except the slack branch) is incident.

6. The method for identifying the topology of an electric power network (1) according to claim 1, wherein the Maximum Likelihood Estimation of step III is implemented in the form of multiple linear regression.

7. The method for identifying the topology of an electric power network (1) according to claim 1, wherein the Maximum Likelihood Estimation of step III is performed while assuming that the correlations between two error terms corresponding to consecutive time-steps are contained in the interval between $-0.7$ and $-0.3$, and that the correlations between two error terms corresponding to non-consecutive time-steps are contained in the interval between $-0.3$ and $0.3$.

8. The method for identifying the topology of an electric power network (1) according to claim 1, wherein a preexisting commercial network provided by a mobile operator serves as the communication network.

9. The method for identifying the topology of an electric power network (1) according to claim 1, wherein the metering units are synchronized by means of the Network Time Protocol (NTP) via the communication network.

10. The method for identifying the topology of an electric power network (1) according to claim 1, wherein said metering units each comprise a controller and a buffer, and step I is integrally implemented in a decentralized manner by the metering units.

11. The method for identifying the topology of an electric power network (1) according to claim 10, wherein, after step I has been completed, the processing unit accesses the communication network and downloads the timestamped values of currents from the metering units.

12. The method for identifying the topology of an electric power network (1) according to claim 1, wherein the metering units each comprise a controller and working memory, and wherein one of the metering units serves as the processing unit.

13. The method for identifying the topology of an electric power network (1) according to claim 1, wherein the current measurements are average values measured over at least one period of the AC power.

14. The method for identifying the topology of an electric power network (1) according to claim 1, wherein the electric power network is operated in the islanding mode and the electric power network is disconnected from the main grid.

15. The method for identifying the topology of an electric power network (1) according to claim 2, wherein step IV comprises the following sub-step of:
  A. for each column "j" of the current sensitivity coefficient matrix (KII), identify the non-diagonal element $(KII_{i \neq j, j})$ with the largest absolute value, assign the value 1 to this element, and assign the value 1 also to the diagonal element $(KII_{j,j})$, further assign the value 0 to all other non-diagonal elements.

16. The method for identifying the topology of an electric power network (1) according to claim 2, wherein step IV comprises the following sub-steps:
  a. obtain the "absolute current sensitivity matrix" by assigning to each element of the current sensitivity coefficient matrix the modulus of the estimated value of the corresponding element;
  b. for each column of the absolute current sensitivity matrix, identify the non-diagonal element with the largest value and assign the value 1 to this element, further assign the value 0 to all other non-diagonal elements, in such a way as to obtain a square "binary current sensitivity matrix" with exactly two non-zero elements in each column;
  c. determine the position of the row and of the column of the matrix obtained in step IV corresponding to said first metering unit by computing a first (C) and a second (R) vector, the components of which are equal to the sum of the elements respectively in each column and in each row of the matrix; and by further computing a third vector (S), the components of which are obtained by dividing each component of the second vector (R) by the corresponding component of the first vector (C), the position in the matrix obtained in step IV of the row and of the column corresponding to said first metering unit can then be determined by identifying the component of the third vector (S) having the highest value;
  d. remove the column corresponding to the first metering unit from the binary current sensitivity matrix obtained in step V, so as to obtain the network incidence matrix with two non-zero elements in each column indicating the two nodes on which each particular branch (except the slack branch) is incident.

17. The method of claim 7, wherein the Maximum Likelihood Estimation of step III is performed while assuming that the correlations between two error terms corresponding to consecutive time-steps are contained in the interval between −0.6 and −0.4.

18. The method of claim 7, wherein the Maximum Likelihood Estimation of step III is performed while assuming that the correlations between two error terms corresponding to consecutive time-steps are about equal to −0.5.

19. The method of claim 7, wherein the correlations between two error terms corresponding to non-consecutive time-steps are contained in the interval between −0.2 and 0.2.

20. The method of claim 7, wherein the correlations between two error terms corresponding to non-consecutive time-steps are about 0.0.

\* \* \* \* \*